United States Patent [19]
Noble et al.

[11] Patent Number: 6,060,754
[45] Date of Patent: May 9, 2000

[54] CIRCUIT AND METHOD FOR GATE-BODY STRUCTURES IN CMOS TECHNOLOGY

[75] Inventors: Wendell P. Noble, Milton, Vt.; Leonard Forbes, Corvallis, Oreg.

[73] Assignee: Micron Technology, Inc., Boise, Id.

[21] Appl. No.: 09/323,493

[22] Filed: Jun. 1, 1999

Related U.S. Application Data

[63] Continuation of application No. 09/050,579, Mar. 30, 1998.
[51] Int. Cl.[7] .......................... H01L 29/76; H01L 29/94; H01L 31/062; H01L 31/113; H01L 31/119
[52] U.S. Cl. .......................... 257/370; 257/369; 257/372
[58] Field of Search .................................. 257/369, 370, 257/372

[56] References Cited

U.S. PATENT DOCUMENTS

| | | | |
|---|---|---|---|
| 4,450,048 | 5/1984 | Gaulier | 204/15 |
| 4,673,962 | 6/1987 | Chatterjee et al. | 357/23.6 |
| 4,922,315 | 5/1990 | Vu | 357/35 |
| 4,987,089 | 1/1991 | Roberts | 437/34 |
| 4,996,574 | 2/1991 | Shirasaki | 357/23.7 |
| 5,006,909 | 4/1991 | Kosa | 357/23.6 |
| 5,023,688 | 6/1991 | Ando et al. | 357/42 |
| 5,097,381 | 3/1992 | Vo et al. | 361/313 |
| 5,122,848 | 6/1992 | Lee et al. | 357/23.6 |
| 5,250,450 | 10/1993 | Lee et al. | 437/40 |
| 5,315,143 | 5/1994 | Tsuji | 257/351 |
| 5,350,934 | 9/1994 | Matsuda | 257/139 |
| 5,379,255 | 1/1995 | Shah | 365/185 |
| 5,491,356 | 2/1996 | Dennison et al. | 257/306 |
| 5,508,544 | 4/1996 | Shah | 257/316 |
| 5,528,062 | 6/1996 | Hsieh et al. | 257/298 |
| 5,541,432 | 7/1996 | Tsuji | 257/350 |
| 5,554,870 | 9/1996 | Fitch et al. | 257/334 |
| 5,581,104 | 12/1996 | Lowrey et al. | |
| 5,585,998 | 12/1996 | Kotecki et al. | 361/321.4 |
| 5,646,900 | 7/1997 | Tsukude et al. | 365/205 |
| 5,680,345 | 10/1997 | Hsu et al. | 365/185.01 |
| 5,691,230 | 11/1997 | Forbes | 437/62 |
| 5,796,143 | 8/1998 | Fulford, Jr. et al. | 257/330 |
| 5,796,166 | 8/1998 | Agnello et al. | 257/751 |
| 5,892,260 | 4/1999 | Okumura et al. | 257/347 |

FOREIGN PATENT DOCUMENTS

431855B1  11/1990  European Pat. Off. ...... H01L 29/772

OTHER PUBLICATIONS

Wolf, S., In: *Silicon Processing for the VLSI Era, vol. 2*, Lattice Press, Sunset Beach, CA, 389–392, (1990).

Chen, M.J., et al., "Back–Gate Forward Bias Method for Low–Voltage CMOS Digital Circuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

(List continued on next page.)

*Primary Examiner*—Ngân V. Ngô
*Attorney, Agent, or Firm*—Schwegman, Lundberg, Woessner & Kluth, P.A.

[57] ABSTRACT

A circuit and method for an improved inverter is provided. The present invention capitalizes on opposing sidewalls and adjacent conductive sidewall members to conserve available surface space on the semiconductor chips. Additionally, the gate and body of the transistors are biased to modify the threshold voltage of the transistor ($V_t$). The conductive sidewall member configuration conserves surface space and achieves a higher density of surface structures per chip. This design provides fast switching capability for low power battery operated CMOS circuits and systems. The transistor structure offers performance advantages from both metal-oxide semiconductor (MOS) and bipolar junction transistor (BJT) designs. The devices can be used in a variety of applications, digital and analog, wherever a more compact structure with low power consumption and fast response time is needed.

22 Claims, 14 Drawing Sheets

OTHER PUBLICATIONS

Chung, I.Y., et al., "A New SOI Inverter for Low Power Applications", *Proceedings of the 1996 IEEE International SOI Conference*, Sanibel Island, FL, 20–21, (Sep. 30–Oct. 3, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Horiguchi, et al., "Switched–Source–Impedance CMOS Circuit for Low Standby Subthreshold Current Giga–Scale LSIs", *IEEE Journal of Solid State Circuits*, vol. 28, 1131–1135, (1993).

Huang, W.L., et al., "TFSOI Complementary BiCMOS Technology for Low Power Applications", *IEEE Transactions on Electron Devices*, 42, 506–512, (Mar. 1995).

Jaeger, et al., "A High–speed Sensing Scheme for 1T Dynamic RAMs Utilizing the Clamped Bit–line Sense Amplifier", *IEEE Journal of Solid State Circuits*, vol. 27, 618–25, (1992).

Ko, et al., "High–gain Lateral Bipolar Action in a MOSFET Structure", *IEEE Trans. on Electron Devices*, vol. 38, No. 11, 2487–96, (Nov. 1991).

MacSweeney, D., et al., "Modelling of Lateral Bipolar Devices in a CMOS Process", *IEEE Bipolar Circuits and Technology Meeting*, Minneapolis, MN 27–30, (Sep. 1996).

Parke, S.A., et al., "A High–Performance Lateral Bipolar Transistor Fabricated on SIMOX", *IEEE Electron Device Letters*, 14, 33–35, (Jan. 1993).

Rabaey, *Digital Integrated Circuits*, Prentice Hall, Englewood Cliffs, NJ, 222–232, (1996).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of Solid–State Circuits*, 26, 525–536, (Apr. 1991).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Tuinega, *A Guide to Circuit Simulation and Analysis Using PSPICE*, Prentice Hall, Englewood Cliffs, NJ, (1988).

Wong, et al., "A 1V CMOS Digital Circuits with Double–Gate Driven MOSFET", *IEEE Int. Solid State Circuits Conference*, San Francisco, 292–93, (1997).

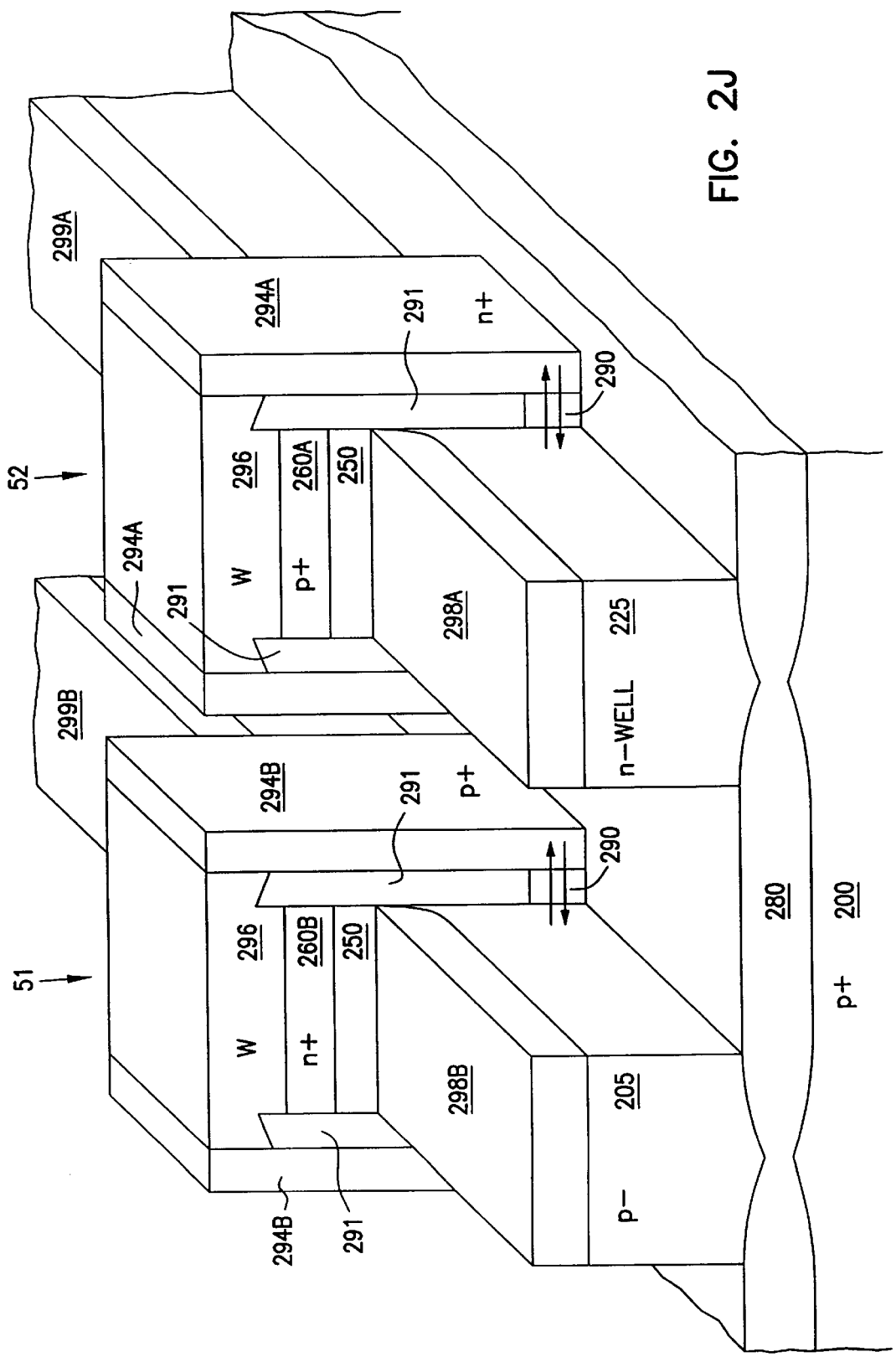

CIRCUIT AND METHOD FOR GATE-BODY STRUCTURES IN CMOS TECHNOLOGY

RELATED APPLICATIONS

This application is a continuation of application Ser. No. 09/050,579, filed Mar. 30, 1998.

This application is related to the following co-filed and commonly assigned applications; attorney docket number 303.413us1, entitled "Circuit and Method for Low Voltage, Voltage Sense Amplifier," attorney docket number 303.402us1, entitled "Circuit and Method for Low Voltage, Current Sense Amplifier," and attorney docket number 303.403us1, entitled "Structure and Method for Gated Lateral Bipolar Transistors," which are hereby incorporated by reference.

FIELD OF THE INVENTION

The present invention relates generally to semiconductor integrated circuits. More particularly, it pertains to a circuit and method for gate-body structures in CMOS technology.

BACKGROUND OF THE INVENTION

Integrated circuit technology relies on transistors to formulate vast arrays of functional circuits. The complexity of these circuits require the use of an ever increasing number of linked transistors. As the number of transistors required increases, the surface space on the silicon chip dwindles. It is one objective then, to construct transistors which occupy less surface area on the silicon chip.

Integrated circuit technology uses transistors conjunctively with Boolean algebra to create a myriad of functional digital circuits, also referred to as logic circuits. In a typical arrangement, transistors are combined to switch or alternate an output voltage between just two significant voltage levels, labeled logic 0 and logic 1. Most logic systems use positive logic, in which logic 0 is represented by zero volts, or a low voltage, e.g., below 0.5 V; and logic 1 is represented by a higher voltage.

One method in which these results are achieved involves Complementary Metal-Oxide Semiconductor (CMOS) technology. CMOS technology comprises a combination of oppositely doped Metal-Oxide Semiconductor Field-Effect Transistors (MOSFETs) to achieve the switching mechanism between voltage levels associated with logic 0 and that of logic 1. This configuration is likewise referred to as an inverter. Conventional CMOS inverters consume an appreciable amount of chip surface area, even despite ongoing reductions in the critical dimensions that are achievable with conventional photolithography techniques. The critical dimension (F) represents the minimum lithographic feature size that is imposed by lithographic processes used during fabrication.

MOSFETs are prevalent in integrated circuit technology because they generally demand less power than their counterpart, bipolar junction transistors (BJTs). BJTs, on the other hand, also possess certain advantages over MOS transistors, such as better switching speed. Therefore, it is another objective, and attempts have been made, to combine the technological designs of bipolars and mosfets in an effort to maximize the benefits of both transistor types.

Various types of lateral transistors have been historically described and utilized in complementary metal-oxide semiconductor (CMOS) technology. Lateral bipolar transistors have received renewed interest with the advent of bipolar complementary metal-oxide semiconductor (BiCMOS) technologies. Recently the action of newer devices has been described in new terms and a more careful distinction made between the different types of transistor action possible. Both gate-body connected MOS transistors and gated lateral bipolar transistors have been described. The term gate-body connected transistors is used to describe vertical or other device structures where the body of the MOS transistor also serves as the base of a bipolar transistor but each device functions separately as a normal transistor and MOS transistor action is dominant. Applying the gate voltage to the body serves primarily to change the threshold voltage of the MOS transistor.

Other structures are possible where the gate and base are common and the bipolar transistor and MOS transistor are in parallel but the bipolar transistor current is dominant. In a gated lateral transistor, not only the structures but also the operation is merged and most current flows along a surface under the gate in either MOS or bipolar operation. In the case of a gated lateral bipolar transistor, at low gate voltages around threshold ($V_t$) they can act as gate-body connected MOS transistors. At higher input voltages, $V_t$ or more, the bipolar action can dominate and they are more appropriately described as gated lateral bipolar transistors.

Much effort has been placed into the study of these merged transistor structures. Both vertical and lateral structures have been studied. These studies do not look to solutions for conserving precious die space in the fabrication of integrated circuits. Likewise, previous efforts have not been able to maximize low power operation and simultaneously maximize switching speeds. It is desirable then to invent structures, circuits and methods which can accommodate the faster switching speed and low power consumption. Any improved configuration of transistor structure should desirably remain fully integrateable with prevalent integrated circuit design.

SUMMARY OF THE INVENTION

The above mentioned problems with logic circuits, memory devices and other problems are addressed by the present invention and will be understood by reading and studying the following specification. A circuit and method, which accords the benefits mentioned above, is provided.

In particular, an illustrative embodiment of the present invention includes an inverter circuit. The inverter circuit includes a complementary pair of gate-body transistors. The complementary pair includes a first channel type transistor and a second channel type transistor. Each gate-body transistor includes a body region formed of single crystalline semiconductor material that extends outwardly from a substrate. The body region has an upper surface and opposing sidewalls. A source region and a drain region are formed within a portion of the upper surface of the body region. A gate is formed above the upper surface of the body region. Conductive sidewall members are disposed adjacent to the opposing sidewalls of the body region. An electrical contact is formed between drain regions of the complementary pair to provide an output for the inverter. A gate contact interconnects the gates of the complementary pair and provides an input to the inverter.

In another embodiment, a method of fabricating an inverter is provided. The method includes forming a complementary pair of gate-body transistors. The complementary pair includes a first channel type transistor and a second channel type transistor. Forming each gate-body transistor includes forming a body region of single crystalline semiconductor material that extends outwardly from a substrate.

The body region is formed to have an upper surface and opposing sidewalls. A source region and a drain region are formed within a portion of the upper surface of the body region. A gate is formed above the upper surface of the body region. Conductive sidewall members are formed adjacent to the opposing sidewalls of the body region. An electrical contact is formed between drain regions of the complementary pair to provide an output for the inverter. A gate contact is formed to interconnect the gates of the complementary pair to provide an input to the inverter.

In another embodiment, an information handling system is provided. The information handling system includes a central processing unit, a random access memory, and a system bus. The system bus communicatively couples the central processing unit and the random access memory. The information handling system further includes an inverter formed according to the above description.

Thus, a circuit and method are provided for an improved inverter. The inverter structure includes gate-body transistors which have opposing sidewalls and adjacent conductive sidewall members to conserve available surface space on a semiconductor chip. The transistors combine BJT and MOS transistor conduction. These new transistor structures allow for low voltage level operation and enhanced switching action over conventional bipolar complementary metal-oxide semiconductor (BiCMOS) devices. The gate-body transistors are fully compatible with CMOS technology. Thus, the present inverter does not require additional chip surface space, nor additional processing steps.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIGS. 2A–2J illustrate an embodiment of a process of fabrication of an inverter according to the teachings of the present invention.

DETAILED DESCRIPTION

Figure 1A:
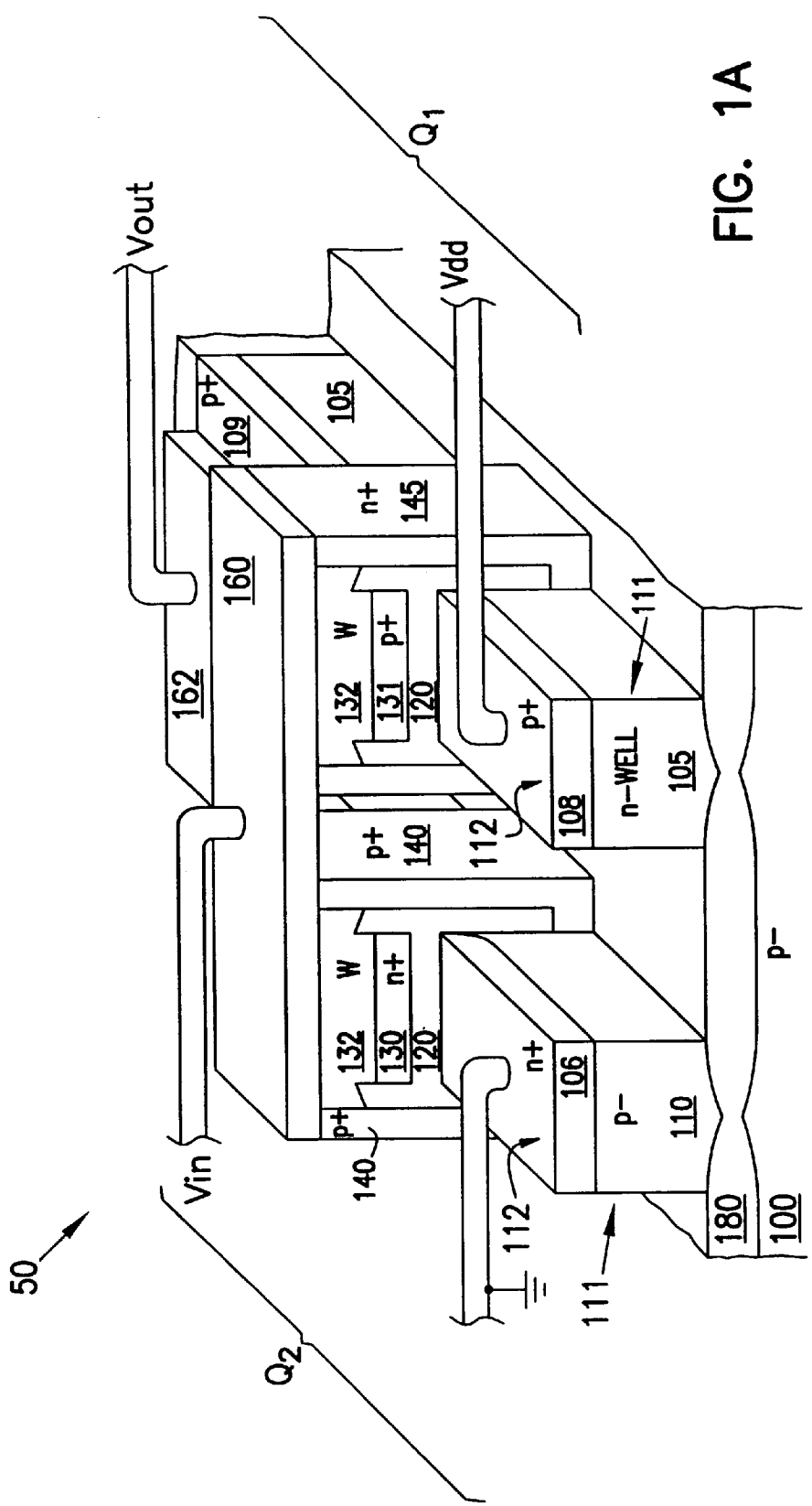
FIG. 1A is a perspective view illustrating an inverter according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n and p-type semiconductor materials, respectively.

FIG. 1A is a perspective view illustrating generally an embodiment of a portion of an inverter according to the teachings of the present invention. Specifically, inverter 50 is a two transistor device that is formed using, for example, the technique described below with respect to FIGS. 2A through 2J. The inverter is formed from a complementary pair of gate body transistors. The complementary pair includes a first channel type transistor and a second channel type transistor. Each transistor in inverter 50 is either an n-channel metal-oxide semiconductor (NMOS) or a p-channel metal-oxide semiconductor (PMOS).

The inverter 50 includes one NMOS transistor $Q_2$ and one PMOS transistor $Q_1$. Each NMOS and PMOS transistor includes a body region, 110 and 105 respectively, formed of single crystalline semiconductor material that extends outwardly from a substrate. The body regions 110 and 105 have an upper surface 112 and opposing sidewalls 111. In one embodiment, the NMOS body region 110 is formed of p– silicon material and the PMOS body region 105 is formed of n– silicon material.

The substrate 100 is p– silicon material. In an exemplary embodiment, the NMOS and PMOS body regions, 110 and 105 respectively, are formed on an insulator layer 180 formed on the substrate 100. The NMOS and PMOS transistors include source regions, 106 and 108 respectively, formed within the upper surface 112 of the body regions, 110 and 105 respectively. Likewise, each of the NMOS and PMOS transistors include a drain region, 107 and 109 respectively, formed within the upper surface 112 of the body regions, 110 and 105 respectively.

A dielectric layer 120 is formed on the upper surface 112 and on portions of the opposing sidewalls 111 for the NMOS and PMOS transistors. The NMOS transistor $Q_2$ includes a gate 130 on the dielectric layer 120. The PMOS transistor $Q_1$ includes a gate 131 formed on the dielectric layer 120. In one embodiment, gate 131 is formed of p+ silicon material and gate 130 is formed of n+ silicon material. The NMOS transistor $Q_2$ includes conductive sidewall members 140. The PMOS transistors $Q_1$ similarly includes conductive sidewall members 145. In one embodiment, the conductive sidewall members 140 are formed of p+ silicon material and the conductive sidewall members 145 are formed of n+ silicon material. Conductive sidewall members, 140 and 145 respectively, are disposed adjacent to portions of the dielectric layer 120 formed on the opposing sidewall surfaces 111. In one embodiment, the conductive sidewall members, 140 and 145 respectively, couple to the gates, 130 and 131 respectively, of the NMOS and PMOS transistors. The conductive sidewall members, 140 and 145 respectively, further couple to a portion of the opposing sidewalls 111 of the NMOS and PMOS transistors such that the transistors give metal-oxide semiconductor (MOS) type conduction and bipolar junction transistor (BJT) type conduction underneath the gates, 130 and 131 respectively. In one embodiment, the conductive sidewall members, 140 and 145 respectively, are formed of polysilicon.

Inverter 50 also includes a gate contact 160. Gate contact 160 couples to gate 130 of transistor $Q_2$ through a refractory metal 132. Gate contact 160 couples to gate 131 of transistor $Q_1$ through a refractory metal 132. The gate contact 160 provides an input to the inverter 50. Further, the inverter 50 includes an electrical contact 162 between the drain regions, 107 and 109, to provide an output for the inverter 50. The source region 106 of transistor $Q_2$ is coupled to ground and the source region 108 of transistor $Q_1$ is coupled to the power supply $V_{dd}$.

Figure 1B:
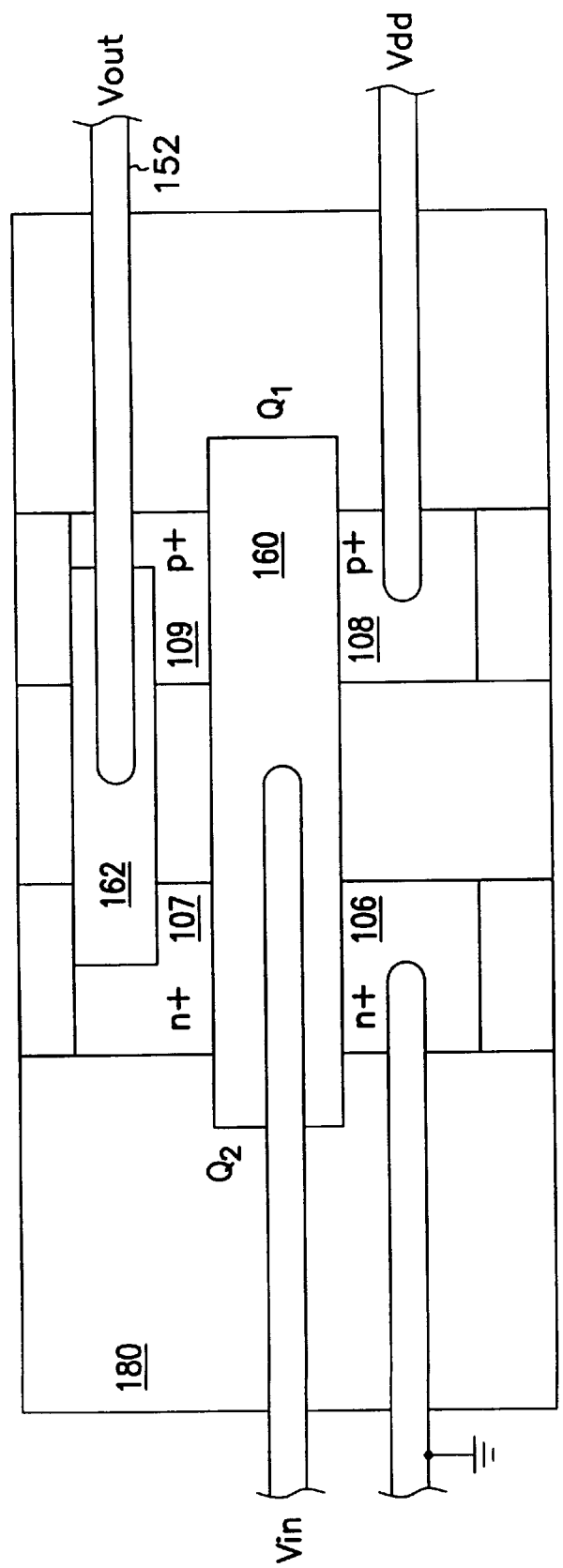
FIG. 1B is a top view of the inverter shown in FIG. 1A.

FIG. 1B is a top view of the embodiment of FIG. 1A. FIG. 1B illustrates the gate contact 160 serving as the input to the inverter 50 and the electrical contact 162 serving as the output for the inverter 50.

Figure 1C:
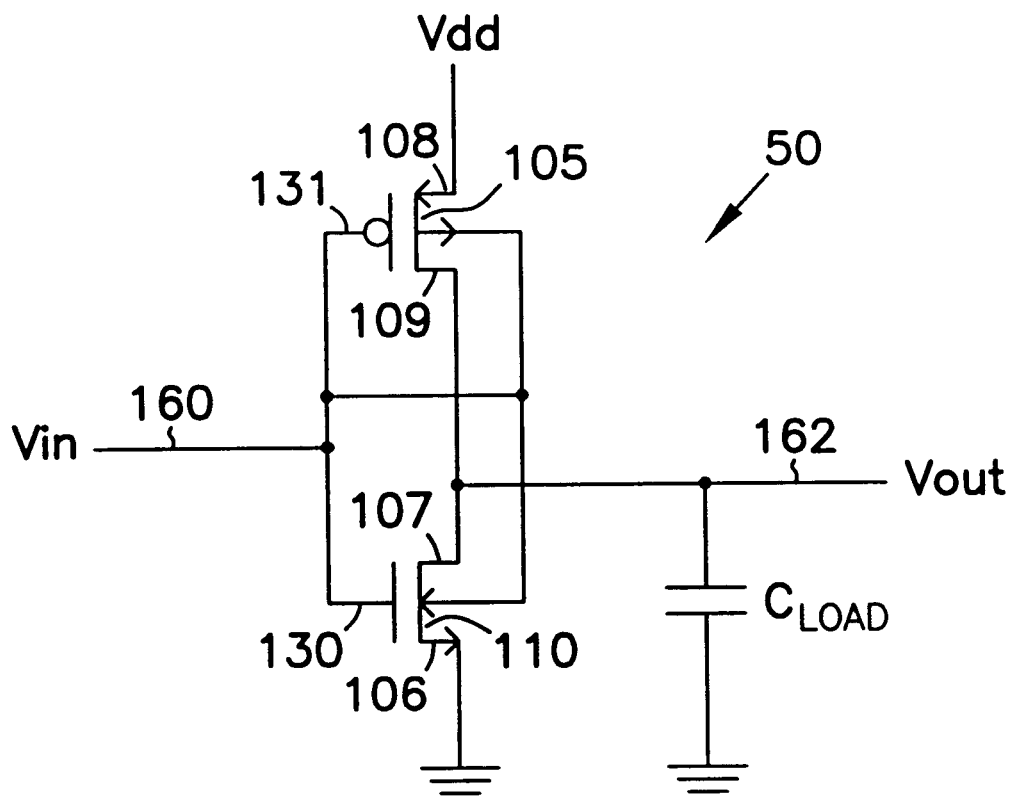
FIG. 1C is a schematic diagram illustrating an embodiment of the inverter of FIG. 1A.

FIG. 1C is a schematic diagram of the inverter shown in FIG. 1A. The operation of the embodiment of FIG. 1A is described in connection with the schematic diagram of FIG. 1C. In operation, inverter 50 receives a "high" or "low" voltage input corresponding to a logic "1" or logic "0". The voltage input is coupled to the gate contact 160. The input on the gate contact 160 is simultaneously coupled to the gates, 130 and 131, and to the body regions, 110 and 105, of the NMOS and PMOS transistors through the conductive sidewall members, 140 and 145 respectively. In this arrangement, the structure combines metal-oxide semiconductor (MOS) conduction underneath the gate with bipolar junction transistor (BJT) conduction in the body region, 110 or 105, of the activated transistor. The "merged" conduction, in effect reduces the voltage threshold level $(V_t)$ for turning on the transistor and results in quicker activation or switching speed for the "triggered" transistor.

Conduction in the body region, 110 or 105, of either the NMOS or PMOS transistors couples the source region, 106 or 108, and the drain region, 107 or 109, within the same transistor. The source regions, 106 and 108, of the NMOS and PMOS transistors are both electrically connected to external potential levels. The potential level connected to the conducting transistor is carried to the associated drain region, 107 or 109, and to the electrical contact 162 which serves as the output to the inverter.

Figure 2A:
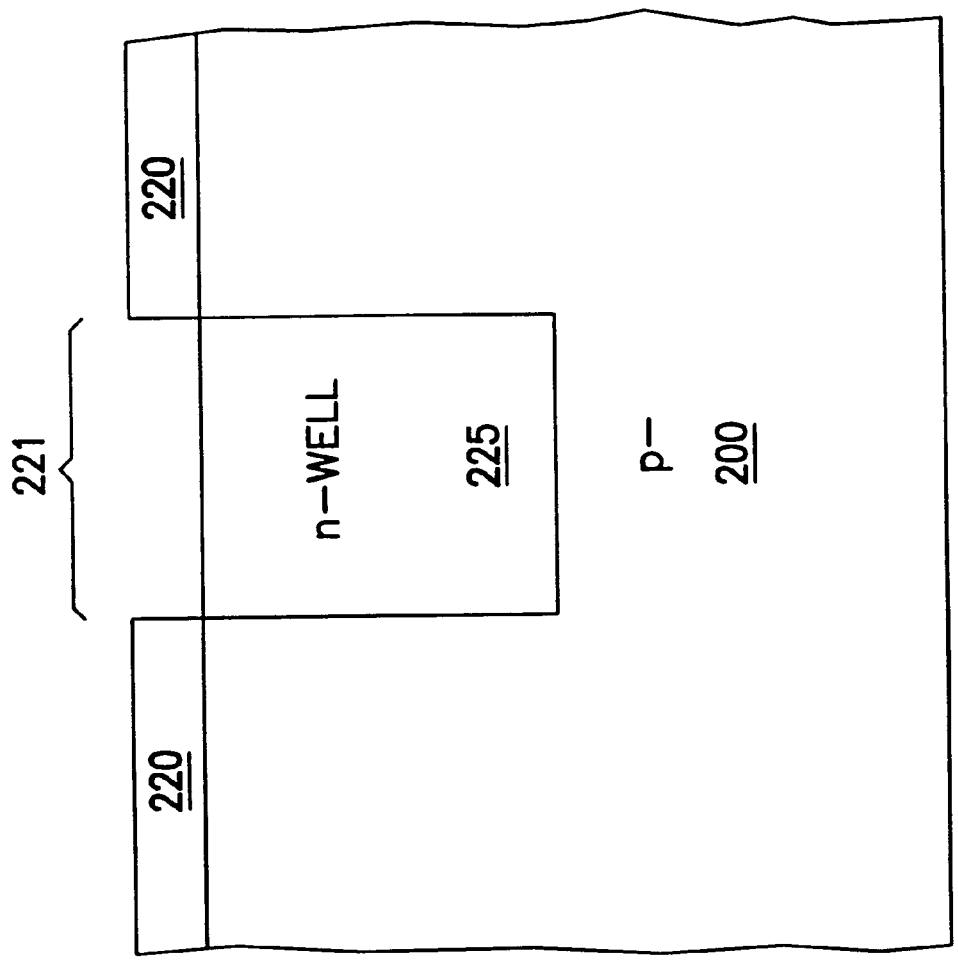

FIGS. 2A through 2J illustrate an embodiment of the various processing steps for fabricating a inverter formed from a complementary pair of gate-body transistors. FIG. 2A begins with a lightly doped p− silicon substrate 200. A thin oxide pad layer is grown and then additional oxide is deposited on the substrate, such as by chemical vapor deposition (CVD), to form oxide layer 220. The oxide layer 220 is formed to a thickness of approximately 0.2 micrometers ($\mu$m). A photoresist is applied and selectively exposed to reveal p-channel metal oxide semiconductor (PMOS) device region 221. The oxide layer 220 is etched from the PMOS device regions 221, such as by reactive ion etching (RIE). Wells of n-type silicon material are formed in the substrate 200 to form the PMOS device regions 221. The n-wells 225 of n-type material can be formed by any suitable method, such as by ion implantation. The n-wells 225 are formed to a thickness of approximately 0.4 $\mu$m. The photoresist is removed using conventional photoresist stripping techniques. The structure is now as it appears in FIG. 2A.

Figure 2B:
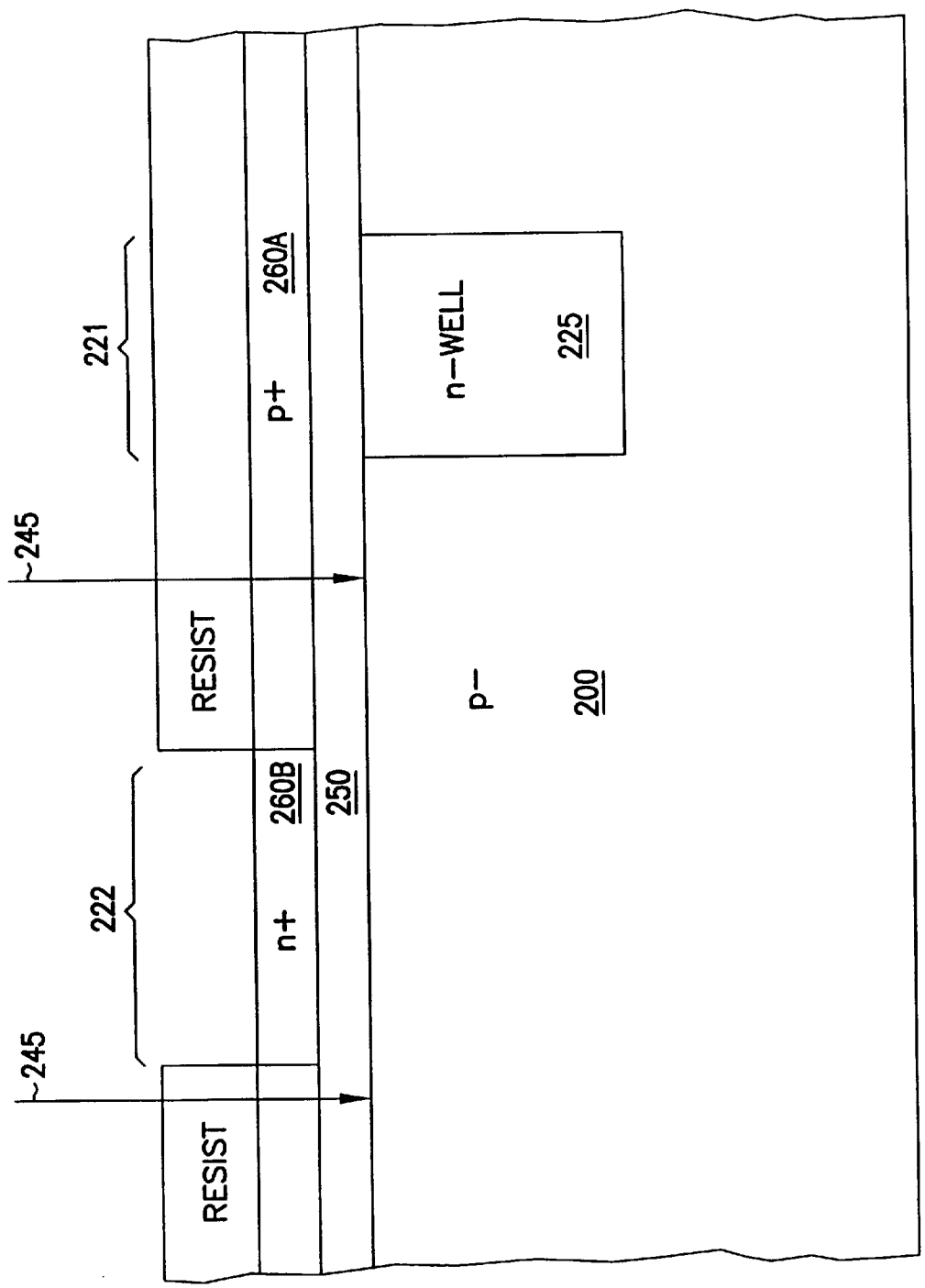

FIG. 2B illustrates the structure after the next sequence of processing steps. The oxide layer 220 is stripped, such as by RIE and a fresh gate oxide 250 is themally grown on and across the upper surface 245 of the n-well 225 and the p− substrate 200. A p+ polysilicon gate material 260A is deposited across the surface of the oxide layer 250. The p+ layer 260A is formed to a thickness of approximately 0.2 $\mu$m. The p+ layer 260A can be deposited through any suitable method, such as through chemical vapor deposition (CVD). A photoresist is applied and selectively exposed to provide a mask-defining an n-channel metal-oxide semiconductor (NMOS) device region 222. An n+ polysilicon gate material 260B is formed in the NMOS device region 222 through a process such as ion implantation of n-type impurity ions. In one embodiment, the n+ dopant is Arsenic (As). The structure is now as appears in FIG. 2B.

Figure 2C:
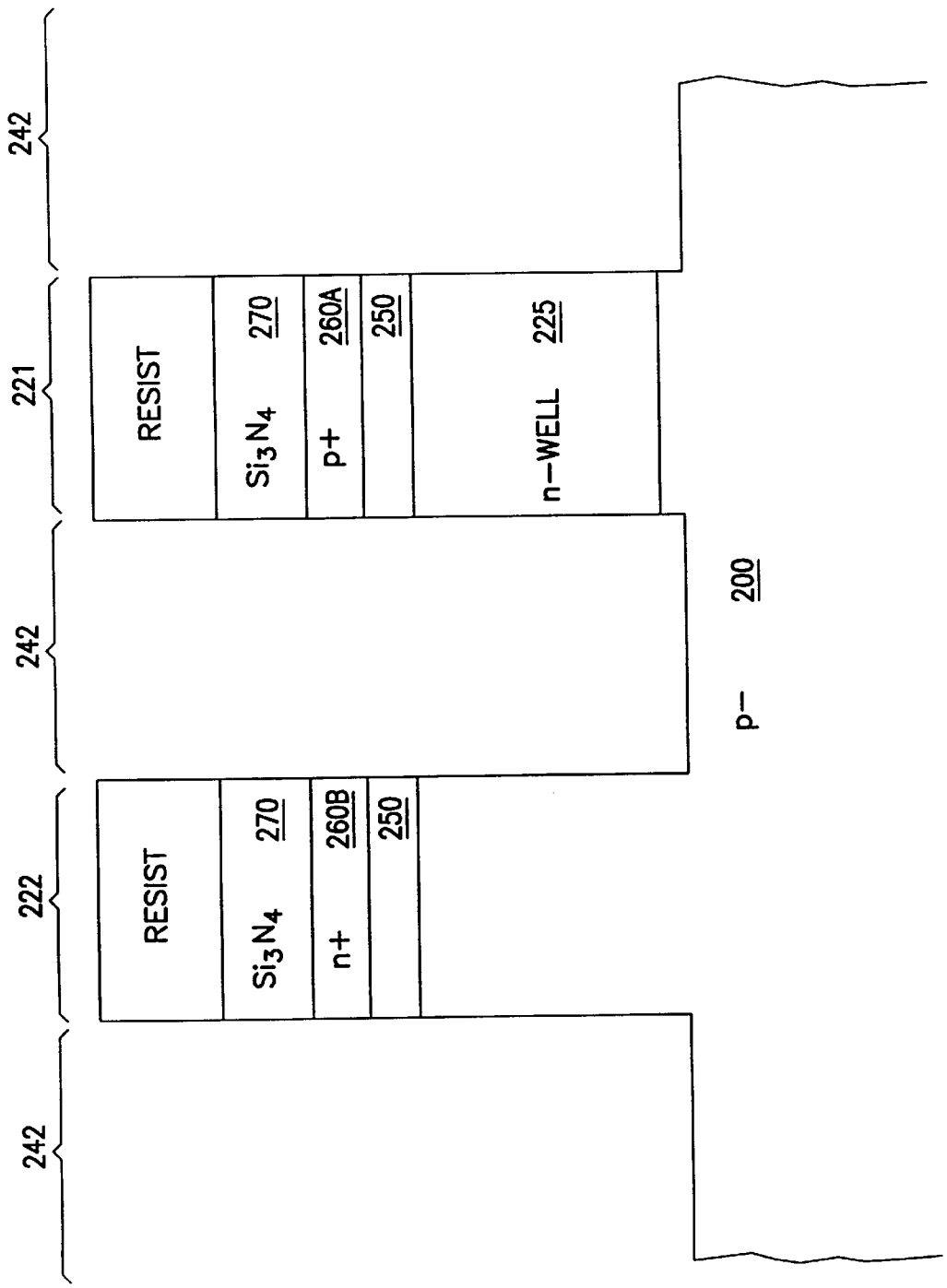

FIG. 2C illustrates the structure after the next sequence of processing steps. The photoresist is stripped, using conventional photoresist stripping techniques. A nitride pad 270 is formed on and across the surface of the n+ gate material 260B and the p+ gate material 260A. The nitride pad 270 is deposited by any suitable process, such as chemical vapor deposition (CVD). The nitride pad is deposited to a thickness of approximately 0.4 $\mu$m. A photoresist is applied and selectively exposed to provide a mask which defines and covers the PMOS and NMOS device regions, 221 and 222 respectively. The nitride cap 270 in between device regions, 221 and 222, is removed. The nitride cap 270 is removed by any suitable etching technique, such as by RIE. The p+ gate material 260A in between device regions, 221 and 222, is removed. And, the gate oxide 250 in between device regions, 221 and 222, is removed. Each of these materials can be removed by etching using the RIE technique.

Still using the photoresist as a mask, the etching process is continued into the p− substrate 200 to a depth of approximately 0.2 $\mu$m below the bottom of the n-well 225/substrate 200 interface. The etching is performed through any suitable process, such as by RIE. These etching steps leave trenches 242 between the device regions 221 and 222. The structure is now as shown in FIG. 2C. The photoresist is next stripped, using conventional photoresist stripping techniques.

Figure 2D:
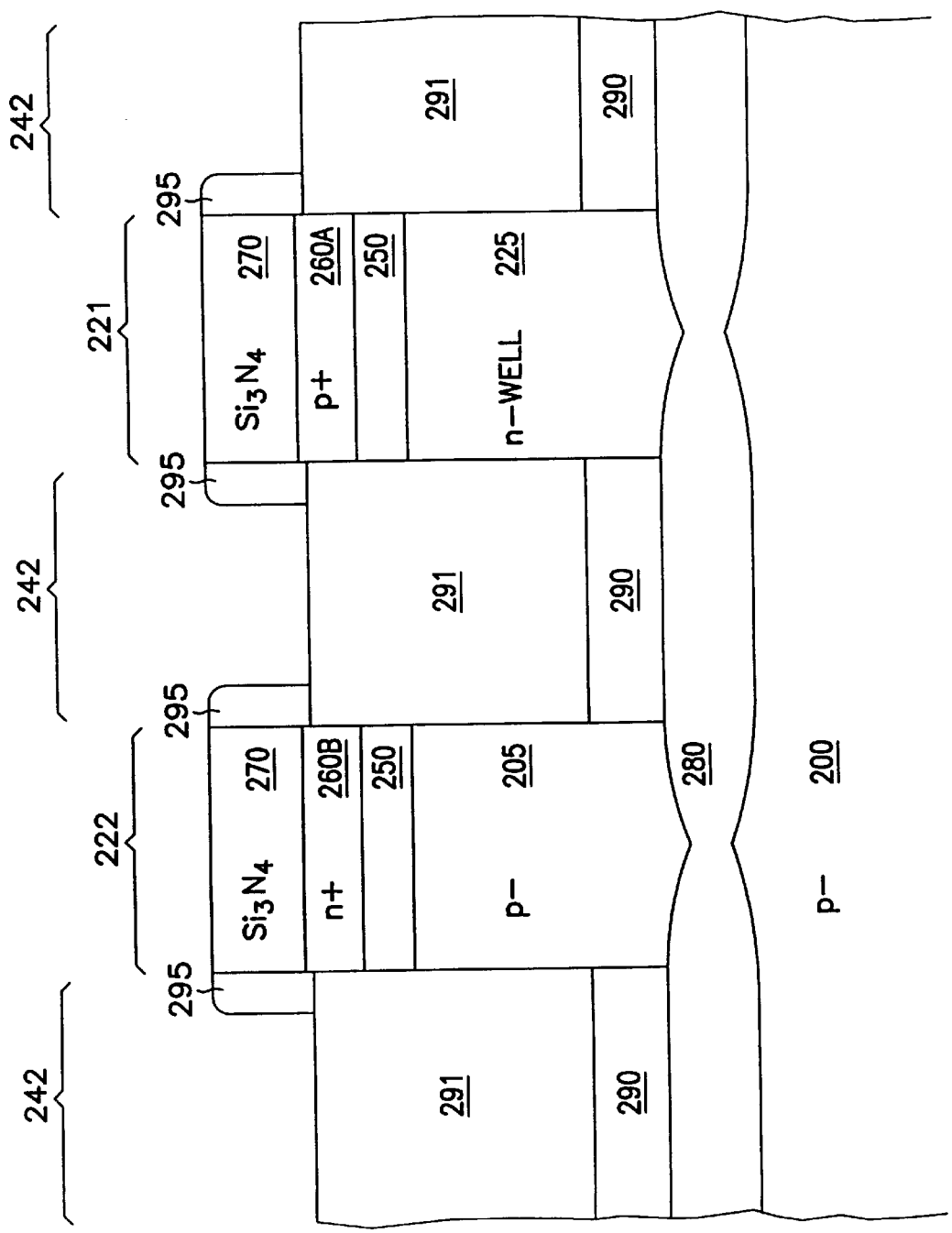

FIG. 2D illustrates the structure after the next series of processing steps. An insulator layer 280 is formed beneath the device regions, 221 and 222 respectively so as to form a semiconductor on insulator (SOI) structure. The insulator layer 280 is formed using, for example, the techniques of U.S. application Ser. No. 08/745,708, entitled Silicon-On-Insulator Islands and Method for Their Formation (the '708 Application), or U.S. Pat. No. 5,691,230, entitled Technique for Producing Small Islands of Silicon on Insulator (the '230

Patent). The '708 Application and the '230 Patent are incorporated by reference. The insulator layer 280 separates from substrate 200 the p– single crystalline silicon structure 205 of the NMOS device region 222, and the n-well 225 single crystalline silicon structure of the PMOS device region 221.

Next, intrinsic polysilicon 290 is deposited by any suitable methods, such as by CVD, to fill the trenches 242. The intrinsic polysilicon 290 in trenches 242 can be planarized by any suitable process, such as by chemical mechanical polishing/planarization (CMP) stopping on the nitride pads 270. The intrinsic polysilicon 290 is directionally etched back to leave approximately 0.1–0.2 μm on the bottom of the trenches 242. The etch can be performed using any suitable method such as reactive ion etching (RIE). Oxide 291 is deposited such as by CVD to fill trenches 242. The oxide 291 is etched back approximately 0.4 μm to the level of the top of the gates 260. A nitride spacer 295 is deposited such as by CVD. The nitride spacer 295 is directionally etched to leave on the exposed vertical sidewalls of the nitride pad 270. The structure is now as shown in FIG. 2D.

Figure 2E:
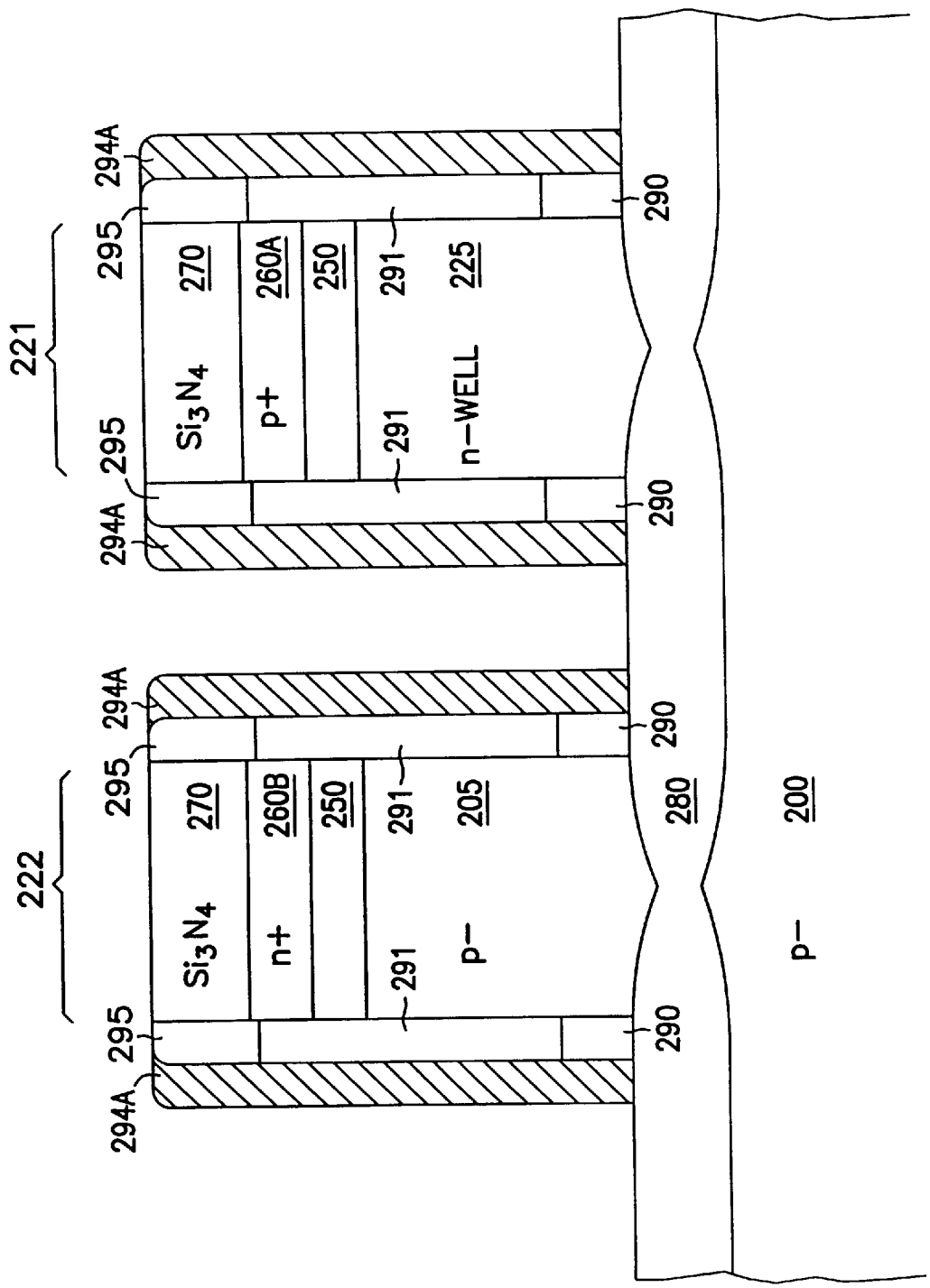

FIG. 2E illustrates the structure following the next sequence of process steps. The oxide 291 and the intrinsic polysilicon 290 are directionally etched using the nitride spacer 295 overhang as a mask. An n+ polysilicon layer 294A is deposited by CVD. The n+ polysilicon 294A is etched, such as by reactive ion etching, to leave on the vertical sidewalls of the oxide spacer 291. The n+ polysilicon layer 294A serves as the conductive sidewall members for the PMOS device region 221. The structure is now as shown in FIG. 2E.

Figure 2F:
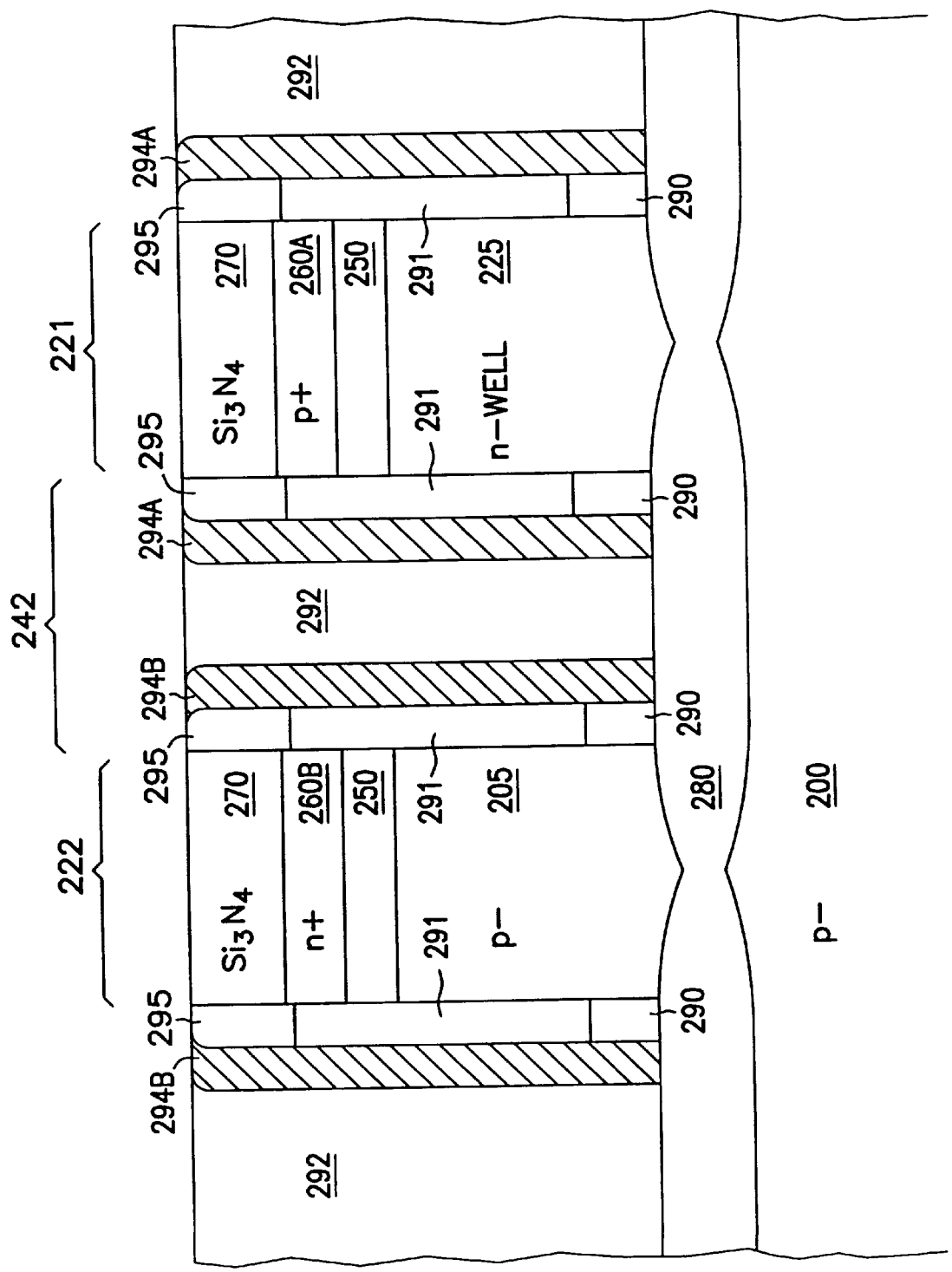

FIG. 2F illustrates the structure after the next sequence of process steps. Silicon dioxide 292 is deposited in the trenches 242 and then planarized using CMP. The silicon dioxide 292 may be deposited by any suitable method, such as by CVD. A photoresist is applied and selectively exposed to reveal only the NMOS device regions 222. The exposed n+ polysilicon 294A is selectively etched to remove from the sidewalls of the NMOS device regions 222. A p+ polysilicon layer 294B is then deposited by CVD to fill the slots left from removal of the n+ polysilicon 294A and is then removed from the top surface by any suitable method, such as RIE or CMP. The p+ polysilicon layer 294B serves as the conductive sidewall members for the NMOS device region 222. The structure is now as shown in FIG. 2F.

Figure 2G:
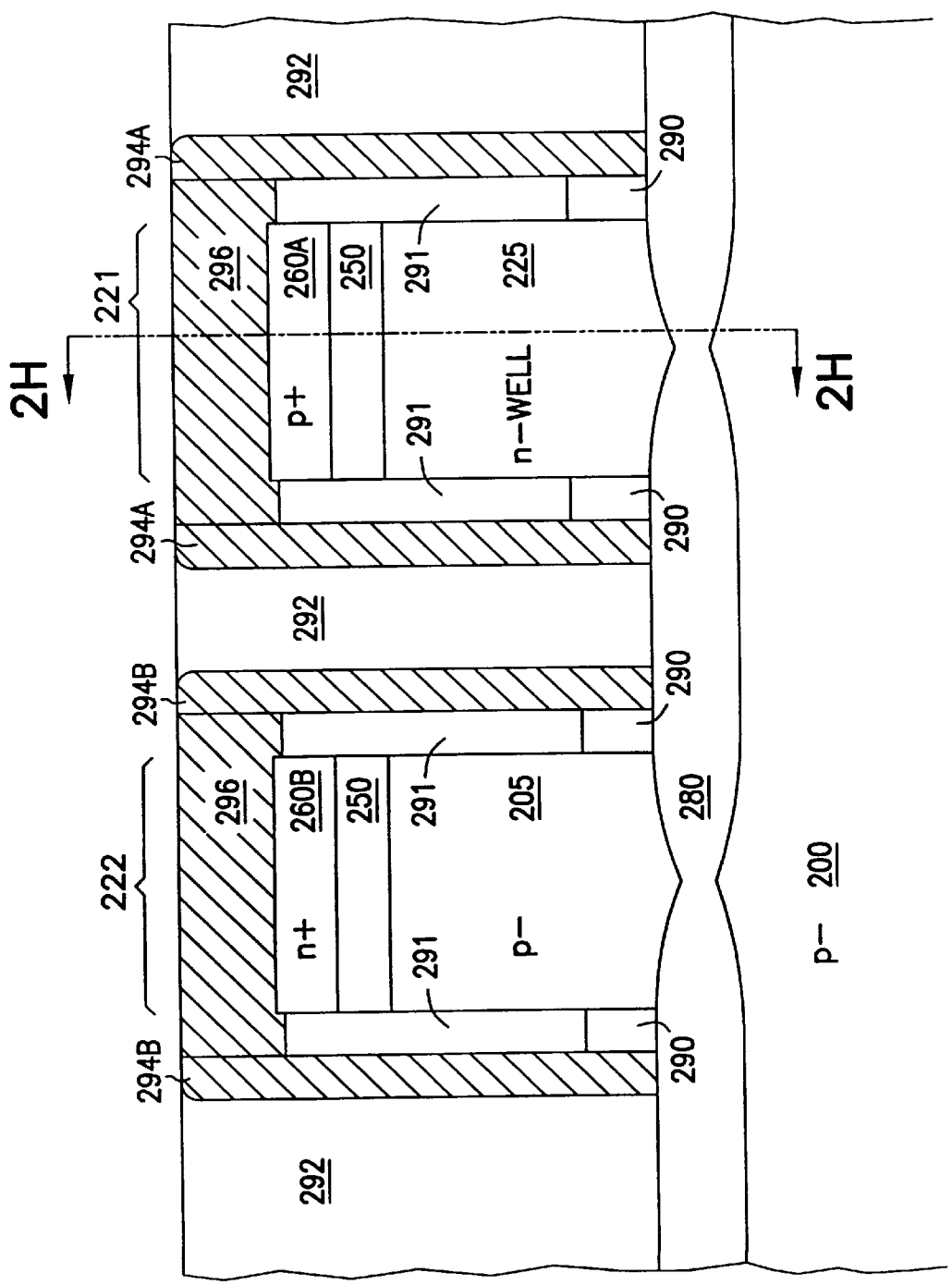

FIG. 2G illustrates the structure following the next sequence of process steps. A phosphoric acid is applied to remove the nitride cap 270 and the nitride spacer 295 from the active device regions, 221 and 222 respectively. Removal of the nitride cap 270 and the nitride spacer 295 exposes the p+ and n+ gate material, 260A and 260B respectively. A gate contact 296 is deposited, such as by CVD, over the p+ and n+ gate regions, 260A and 260B respectively. In one embodiment, the gate contact 296 is formed of tungsten (W). In another embodiment, the gate contact 296 is any other suitable refractory metal. The gate contact 296 is planarized, such as by CMP, such that the gate contact 296 is left only over the p+ and n+ gate regions, 260A and 260B respectively. The device is now as shown in FIG. 2G.

Figure 2H:
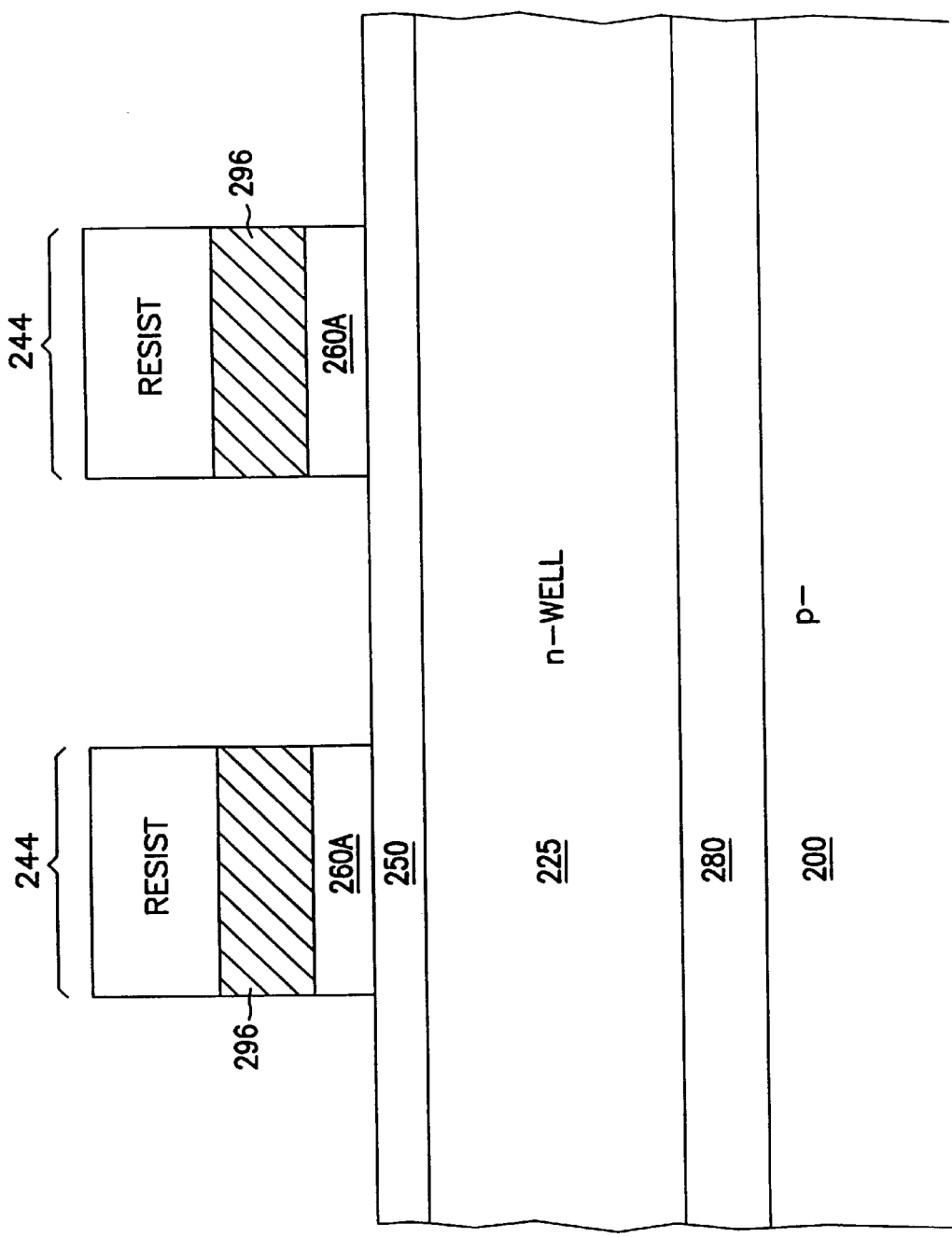
Figure 21:
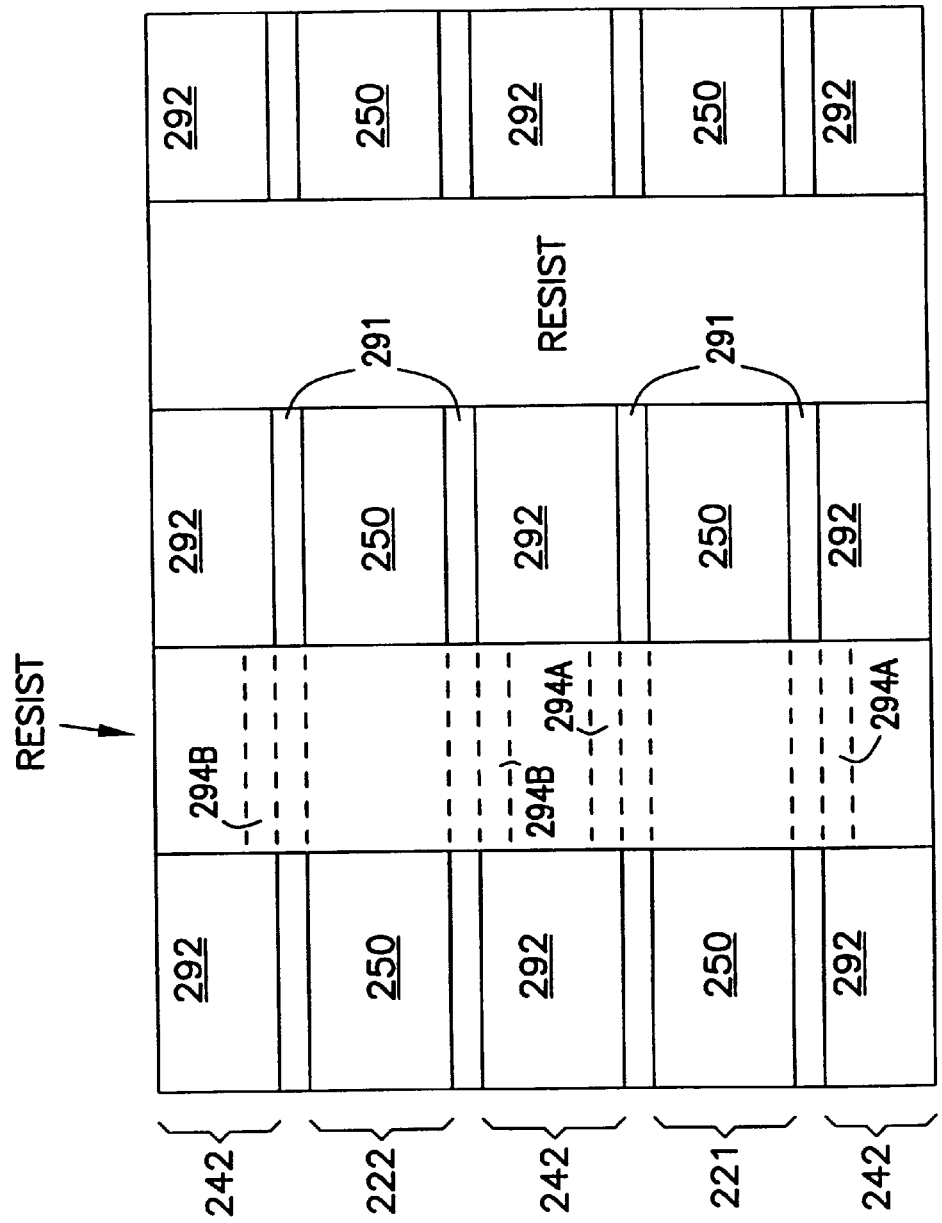

FIG. 2H is a cross sectional view along cut line 2H—2H of FIG. 2G. FIG. 2H illustrates the structure after the following sequence of process steps. A photoresist is applied and selectively exposed to mask the gate regions 244. The gate contact 296 material and the n+ or p+ polysilicon gate material, 260B and 260A, which remain exposed are etched to the underlying gate oxide 250 and insulator layer 280. The etching may be performed using RIE. The structure is now as is shown in FIG. 2H.

FIG. 2I is a top view of FIG. 2H. Using the same mask, the p+ or n+ polysilicon layers 294B and 294A, located between the device regions 221 and 222, are removed by etching. The etching can be performed using any suitable method, such as RIE.

FIG. 2J illustrates the structure following the next series of process steps. The photoresist is removed using conventional photoresist stripping techniques. An anneal is performed to out diffuse boron from the p– layer 205 and to out diffuse Arsenic (As) from the n-well 225. The anneal also serves to out diffuse the dopants from the p+ and n+ polysilicon layers, 294B and 294A respectively. Hence, the annealing serves to dope the adjoining sandwiched intrinsic polysilicon 290. Boron and Arsenic, respectively, will out diffuse into the intrinsic polysilicon 290 in approximately equal amounts. This process step effectively enhances the thickness of the p+ and n+ polysilicon conductive sidewall members, 294B and 294A respectively.

A photoresist is applied and exposed to cover the NMOS gate-body transistor 51. Then, a p+ source region 298A and a drain region 299A are ion implanted using self-aligning process techniques with the gate 260A. The photoresist is then stripped using conventional photoresist stripping techniques.

Another photoresist is applied and exposed, this time to cover the PMOS gate-body transistor 52. Another ion implantation step is used to form an n+ source region 298B and a drain region 299B in the NMOS gate-body transistor 52. The photoresist is once again removed. The structure is now as shown in FIG. 2J.

The remaining contact holes and wiring required to form the inverter 50 are achieved through conventional metallization processing steps. These steps are recited here in reference to FIG. 1A and FIG. 2J. The NMOS and PMOS transistors, 51 and 52 respectfully, form an inverter equivalent to the embodiment of inverter 104 or inverter 105 as shown in FIG. 1A. Accordingly, the NMOS transistor 51 interchangeably represents transistors $Q_2$ or $Q_4$ shown in FIG. 1A. The PMOS transistor 52 equally represents transistors $Q_1$ and $Q_3$ shown in FIG. 1A. To complete the inverter 50, metal shunt 162 is formed, through standard metallization processing, to connect drain regions, 107 and 109 in FIG. 1A or 299A and 299B of FIG. 2J. Gate contact 160 is formed to couple the gates of NMOS and PMOS transistors, 51 and 52 in FIG. 2J or $Q_2$ and $Q_1$ of FIG. 1A. Gate contact 160 is cross-coupled to a similar metal shunt 163 on the drain regions of inverter 104. A gate contact 161, formed to couple the gates of NMOS and PMOS transitors $Q_3$ and $Q_4$, is cross-coupled to metal shunt 162. The cross-coupled gate contacts and metal shunts, 160, 163, 161 and 162 respectively, include contacts to input/output lines 150 and 152 via conventional processing techniques. Bit lines are coupled to the inputs or source/drain regions, 106/298B, of the NMOS transistors, $Q_2$ or $Q_4$ respectively. One skilled in the art will recognize the method to these steps, and hence they are not disclosed as part of this application. Similarly, a supply potential is coupled to both inputs or source/drain regions, 108/298A, of the PMOS transistors, $Q_1$ and $Q_3$ respectively. This conventional metallization process is not recited here.

Figure 3:
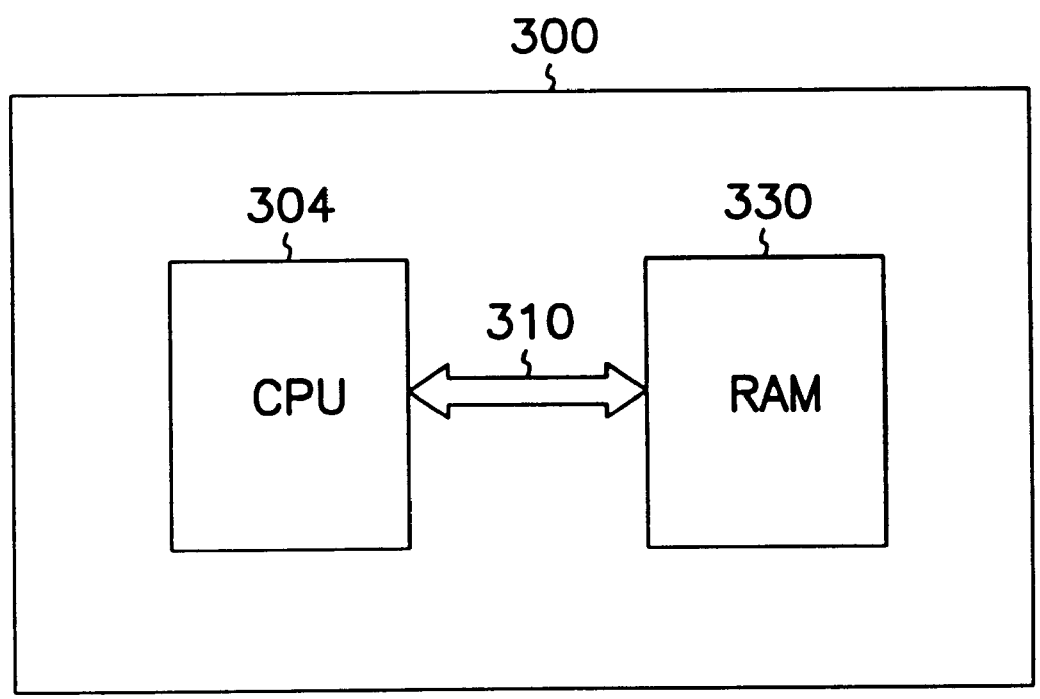
FIG. 3 is a block diagram illustrating an information handling system according to an embodiment of the present invention.

FIG. 3 is a block diagram illustrating an information handling system 300 according to an embodiment of the present invention. The information handling system includes a central processing unit (CPU) 304. The central processing unit 304 is coupled to a memory unit 330 by a system bus 310. By way of illustration and not by way of limitation, the memory unit 330 is a random access memory (RAM). The central processing unit can be constructed to include the inverter structure embodiment presented above.

Conclusion

A circuit and method are provided for an improved inverter. The inverter structure includes gate-body transistors which have opposing sidewalls and adjacent conductive sidewall members to conserve available surface space on a semiconductor chip. Conservation of surface space achieves a higher density of surface structures per chip. The structures offer performance advantages from both metal-oxide semiconductor (MOS) and bipolar junction transistor (BJT) designs. The devices can be used in a variety of applications, digital and analog, wherever a more compact structure with low power consumption and fast response time is needed.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A pair of transistors, each transistor comprising:
   a body region formed extending outwardly from a substrate, the body region having an upper surface and opposing sidewalls;
   a source region and a drain region formed within a portion of the upper surface of the body region, wherein the source region and drain region are separated by a channel region;
   a gate formed above the upper surface of the channel region; and
   conductive sidewall members disposed adjacent to the opposing sidewalls of the body region; and
wherein the gates of the pair are interconnected by a gate contact.

2. The pair of transistors of claim 1, wherein the gate contact comprises an input to the pair of transistors.

3. The pair of transistors of claim 1, wherein the pair of transistors further includes an electrical contact between drain regions of the pair to provide an output for the pair of transistors.

4. The pair of transistors of claim 1, wherein a first transistor in the pair of transistors includes an n-channel metal-oxide semiconductor (NMOS) transistor, and wherein a second transistor in the pair includes a p-channel metal-oxide semiconductor (PMOS) transistor.

5. The pair of transistors of claim 1, wherein a first transistor in the pair of transistors includes an n-channel metal-oxide semiconductor (NMOS) transistor, and wherein a second transistor in the pair of transistors includes an n-channel metal-oxide semiconductor (NMOS) transistor.

6. The pair of transistors of claim 1, wherein each transistor further includes a dielectric layer disposed between the upper surface of the body region and the gate, the dielectric layer being further disposed between the opposing sidewalls of the body region and the conductive sidewall members.

7. The pair of transistors of claim 1, wherein the conductive sidewall members couple to the gate, and wherein the conductive sidewall members couple to a portion of the opposing sidewalls.

8. The pair of transistors of claim 1, wherein each transistor further includes an insulator layer formed between the body region and the substrate.

9. A complementary pair of transistors, each transistor extending outwardly from a substrate, each transistor having a source region, a drain region, and a body region, the body region having an upper surface and opposing sidewalls, wherein each transistor further includes a means for forming an inversion region in a channel region in the body region, and a means for injecting a current into the body region using hot electron injection.

10. The complementary pair of transistors of claim 9, wherein the means for forming an inversion region is further coupled to the means for injecting a current into the body region.

11. The complementary pair of transistors of claim 9, wherein the means for injecting a current into the body region using hot electron injection includes a means for injecting a current into a portion of the opposing sidewalls of the body region.

12. A complementary pair of transistors, each transistor extending outwardly from a substrate, each transistor having a source region, a drain region, and a body region, the body region having an upper surface and opposing sidewalls, wherein each transistor further includes a first means for metal-oxide semiconductor (MOS) conduction in the body region, and a second means, coupled to the first means, for bipolar junction transistor (BJT) conduction in the body region.

13. A complementary pair of transistors, each transistor extending outwardly from a substrate, each transistor having a source region, a drain region, and a body region, the body region having an upper surface and opposing sidewalls, wherein each transistor further includes:
   a gate formed above the upper surface of the body region; and
   conductive sidewall members disposed adjacent to the opposing sidewalls of the body region and coupled to the gate; and
wherein the gates of the complementary pair are interconnected by a gate contact.

14. The complementary pair of transistors of claim 13, wherein the complementary pair of transistors further includes an electrical contact between drain regions of the complementary pair to provide an output for the complementary pair of transistors.

15. The complementary pair of transistors of claim 13, wherein a first one of the complementary pair of transistors includes an n-channel metal-oxide semiconductor (NMOS) transistor.

16. The complementary pair of transistors of claim 13, wherein each transistor further includes a dielectric layer disposed between the upper surface of the body region and the gate, the dielectric layer being further disposed between the opposing sidewalls of the body region and the conductive sidewall members.

17. The complementary pair of transistors of claim 16, wherein the conductive sidewall members couple to a portion of the opposing sidewalls.

18. A method of fabricating a coupled pair of transistors, wherein forming each transistor comprises:
 forming a body region extending outwardly from a substrate, the body region having an upper surface and opposing sidewalls;
 forming a source region and forming a drain region within a portion of the upper surface of the body region, wherein the source region and drain region are separated by a channel region;
 forming a gate above the upper surface of the channel region; and
 forming conductive sidewall members adjacent to the opposing sidewalls of the body region; and
wherein the method of fabricating the coupled pair of transistors includes coupling the conductive sidewall members to the gate in each transistor, and coupling at least one of the conductive sidewall members of a first one of the pair of transistors to at least one of the conductive sidewall members of a second one of the pair of transistors.

19. The method of claim 18, wherein forming each transistor further includes forming a dielectric layer disposed between the upper surface of the channel region and the gate and between the opposing sidewalls of the body region and the conductive sidewall members.

20. The method of claim 18, wherein forming the conductive sidewall members adjacent to the opposing sidewalls includes coupling a portion of the conductive sidewall members to a portion of the opposing sidewalls.

21. The method of claim 18, wherein forming the body region of each transistor includes forming the body region on an insulator layer formed on the substrate.

22. The method of claim 18, wherein forming the conductive sidewall members comprises forming the conductive sidewall members to be more highly doped than the body region.

* * * * *